United States Patent
Yen et al.

(10) Patent No.: US 11,222,971 B2
(45) Date of Patent: Jan. 11, 2022

(54) SILICON CARBIDE SEMICONDUCTOR DEVICE INTEGRATING CLAMPER CIRCUIT FOR CLAMPING VOLTAGE

(71) Applicant: Hestia Power Inc., Hsinchu (TW)

(72) Inventors: Cheng-Tyng Yen, Hsinchu (TW); Chien-Chung Hung, Hsinchu (TW); Fu-Jen Hsu, Hsinchu (TW); Kuo-Ting Chu, Hsinchu (TW)

(73) Assignee: Shanghai Hestia Power Inc., Shanghai (CN)

( * ) Notice: Subject to any disclaimer, the term of this patent is extended or adjusted under 35 U.S.C. 154(b) by 155 days.

(21) Appl. No.: 16/689,428

(22) Filed: Nov. 20, 2019

(65) Prior Publication Data
US 2020/0161466 A1  May 21, 2020

Related U.S. Application Data

(60) Provisional application No. 62/770,714, filed on Nov. 21, 2018.

(51) Int. Cl.
  *H01L 29/78* (2006.01)
  *H01L 29/73* (2006.01)
  *H01L 29/06* (2006.01)
  *H01L 29/16* (2006.01)

(52) U.S. Cl.
  CPC ...... *H01L 29/7803* (2013.01); *H01L 29/0615* (2013.01); *H01L 29/1608* (2013.01); *H01L 29/7302* (2013.01)

(58) Field of Classification Search
  CPC ............ H01L 29/7803; H01L 29/7302; H01L 29/0615; H01L 29/1608; H01L 27/0255; H01L 29/7808; H01L 27/088
  See application file for complete search history.

(56) References Cited

U.S. PATENT DOCUMENTS

| | | | |
|---|---|---|---|
| 6,172,383 B1 | 1/2001 | Williams | |
| 6,413,822 B2 | 7/2002 | Williams et al. | |
| 6,515,345 B2* | 2/2003 | Robb | H01L 21/761 257/105 |
| 7,244,970 B2* | 7/2007 | Cogan | H01L 29/66136 257/173 |
| 9,627,383 B2 | 4/2017 | Kaguchi et al. | |
| 10,103,540 B2* | 10/2018 | Kashyap | H01L 25/50 |
| 2013/0240908 A1* | 9/2013 | Haney | H01L 27/0814 257/77 |
| 2016/0148921 A1* | 5/2016 | Mallikararjunaswamy | H01L 27/0259 257/491 |

* cited by examiner

*Primary Examiner* — Bilkis Jahan
(74) *Attorney, Agent, or Firm* — Muncy, Geissler, Olds and Lowe, P.C.

(57) ABSTRACT

The present invention provides a silicon carbide (SiC) semiconductor device integrating a metal-oxide-semiconductor field-effect transistor (MOSFET) and a bidirectional voltage clamping circuit. An object of protecting a device is achieved by using the simple structure above, effectively preventing device damage that may be caused by a positive overvoltage and a negative overvoltage between a gate and a source.

10 Claims, 8 Drawing Sheets

SILICON CARBIDE SEMICONDUCTOR DEVICE INTEGRATING CLAMPER CIRCUIT FOR CLAMPING VOLTAGE

FIELD OF THE INVENTION

The present invention relates to a semiconductor power device, and particularly to a silicon carbide (SiC) semiconductor device.

BACKGROUND OF THE INVENTION

Due to the presence of a wide energy gap of silicon carbide, given the same drain-to-source voltage (VDS) specification, a specific on-resistance (ron, sp=on resistance*active area) of a silicon carbide metal-oxide-semiconductor field-effect transistor (to be referred to as a SiC MOSFET hereafter) is far less than that of a silicon metal-oxide-semiconductor field-effect transistor (to be referred to as a Si MOSFET hereafter). By comparing transfer characteristics of a Si MOSFET and a SiC MOSFET, it is discovered that, the drain current ($I_D$) of the Si MOSFET rises with the gate voltage (Vgs) and quickly reaches saturation (FIG. 1); however, the drain current ($I_D$) of the SiC MOSFET still continuously rises with a rising of the gate voltage (Vgs) (FIG. 2).

Therefore, a SiC MOSFET is usually operated at a higher gate voltage in exchange for a lower on-resistance and a higher drain current. Also because of the above characteristic, as shown in FIG. 3, a margin M1 between a suggested operating voltage (Vgsop, refer to curve V1 in FIG. 3) and a breakdown voltage (BVgs, refer to curve V2 in FIG. 3) of a gate oxide layer of a SiC MOSFET is smaller than a margin M2 between a suggested operating gate voltage (Vgsop, refer to V3 in FIG. 3) and a breakdown voltage (BVgs, refer to V4 in FIG. 3) of a gate oxide layer of a Si MOSFET.

In one embodiment, the suggested operating voltage of the Si MOSFET is usually in a range from 10 V to 12 V, and the breakdown voltage of the gate oxide layer is equal to or more than 60 V. However, the suggested operating gate voltage of a SiC MOSFET is usually in a range from 15 V to 20 V, and the breakdown voltage of a gate oxide layer is only in a range from 35 V to 50 V.

Because a SiC MOSFET has a small output capacitance and a quick switching speed, ringing of the gate voltage of a SiC MOSFET can be easily resulted by stray capacitance and inductance as well as extremely high di/dt and dv/dt during the switching process. If an overvoltage of the gate exceeds the breakdown voltage of the gate oxide layer during the occurrence of ringing, the gate oxide layer of the SiC MOSFET can be damaged. In addition, because a SiC MOSFET further has a low specific on-resistance and a small input capacitance, the tolerance of the SiC MOSFET against electrostatic discharge (ESD) taking place between the gate and the source is also reduced.

In a Si MOSFET, a unidirectional or bidirectional Zener diode is usually connected in parallel between the gate and the source to protect the gate from damage caused by overvoltage and at the same time to reinforce the tolerance of the gate against ESD. For example, in the prior art, the U.S. Pat. Nos. 6,172,383 and 6,413,822, a polysilicon Zener diode is additionally disposed or integrally disposed to protect the gate and to reinforce the tolerance of the gate against ESD. However, the additionally disposed Zener diode leads issues of increasing packaging complications, occupying space, decreasing reaction speed and inducing additional stray inductance; the integrally disposed polysilicon Zener diode causes instability issues such as a reduced breakdown voltage and an increased leakage current of the polysilicon Zener diode under a high temperature, and is unsuitable for a SiC MOSFET that may be used in high-temperature applications. Further, no matter the polysilicon Zener diode is additionally disposed or integrally disposed, the leakage current thereof is approximately in a scale of μA, which is far greater than the gate leakage current of the MOSFET in a scale of nA. Hence, burden and loss of a gate driving circuit are increased.

Therefore, for example, U.S. Pat. No. 9,627,383 B2 protects the gate by integrating an additional lateral MOSFET; however, it also has issues of a more complicated structure and providing protection for only a negative overvoltage between the gate and the source.

In view of the above, SiC semiconductor devices of the related field yet need to be improved.

SUMMARY OF THE INVENTION

It is an object of the present invention to reduce the risk of damage of a conventional silicon carbide (SiC) semiconductor device during the switching process of the gate, wherein the damage is caused by a gate overvoltage likely generated due to a low specific on-resistance and a small input capacitance of the SiC semiconductor device.

It is another object of the present invention to improve the issue of having a lower tolerance against electrostatic discharge (ESD) occurring between the gate and the source of a conventional SiC semiconductor device, wherein the lower tolerance against ESD is caused by a low specific on-resistance and a small input capacitance of the SiC semiconductor device.

To achieve the objects above, the present invention provides a silicon carbide (SiC) semiconductor device integrating a clamper circuit for clamping voltage, thereby achieving the object of device protection, and effectively preventing device damage possibly caused by a positive overvoltage and a negative overvoltage between the gate and the source.

Therefore, a SiC semiconductor device integrating a clamper circuit for clamping voltage according to an embodiment of the present invention includes: a SiC substrate, a metal-oxide-semiconductor field-effect transistor (MOSFET), and a bidirectional voltage clamp. The SiC substrate comprises a first surface and a second surface opposite to the first surface. The MOSFET comprises a SiC n-type drift layer, a gate, a source and a drain, wherein the SiC n-type drift layer, the gate and the source are disposed adjacent to the first surface and the drain is disposed adjacent to the second surface. The bidirectional voltage clamp is disposed on the first surface, and includes a first terminal connected to the gate and a second terminal connected to the source.

In one embodiment, the MOSFET can be an n-channel MOSFET; the SiC n-type drift layer is provided with a plurality of p-type wells arranged at intervals, at least one p-type region provided at the p-type well, at least one n-type region provided at the p-type well, a insulator disposed on the SiC n-type drift layer, a gate electrode connected to the gate, and a source electrode connected to a part of the n-type region and the p-type region through an ohmic contact.

In one embodiment, the bidirectional voltage clamp includes at least one p-floating region spaced from the p-type well by a first distance, the p-type well floating region includes a first n-type region and a second n-type region, the first n-type region and the second n-type region are separated from each other by a spacer region, the first terminal is connected to the gate electrode by an ohmic contact on the first n-type region, and the second terminal is connected to the source electrode by an ohmic contact on the second n-type region.

In one embodiment, between the first terminal and the spacer region is a second distance, between the second terminal and the spacer region is a third distance, and the second distance is greater than the third distance.

In one embodiment, the p-floating region can include a retrograde doping profile, and the p-floating region comprises a bottom portion and a top portion having a doping concentration lower than that of the bottom portion.

In one embodiment, the MOSFET can be a planar MOSFET.

In one embodiment, the MOSFET can be a trench MOSFET.

In one embodiment, the bidirectional voltage clamp can suppress a positive overvoltage and a negative overvoltage applied between the gate and the source.

In one embodiment, absolute values of the positive overvoltage and the negative overvoltage can smaller than absolute values of positive and negative gate-to-source breakdown voltages of the MOSFET.

In one embodiment, an absolute value of the positive overvoltage can be greater than an absolute value of the negative overvoltage.

In one embodiment, the bidirectional voltage clamp includes a plurality of p-floating regions connected in parallel.

The SiC semiconductor device integrating a MOSFET and a bidirectional voltage clamp of the present invention effectively prevents device damage caused by a positive overvoltage and a negative overvoltage between the gate and the source, further achieving the object of device protection.

DETAILED DESCRIPTION OF THE PREFERRED EMBODIMENTS

Details and technical contents of the present invention are given with the accompanying drawings below.

Figure 1:
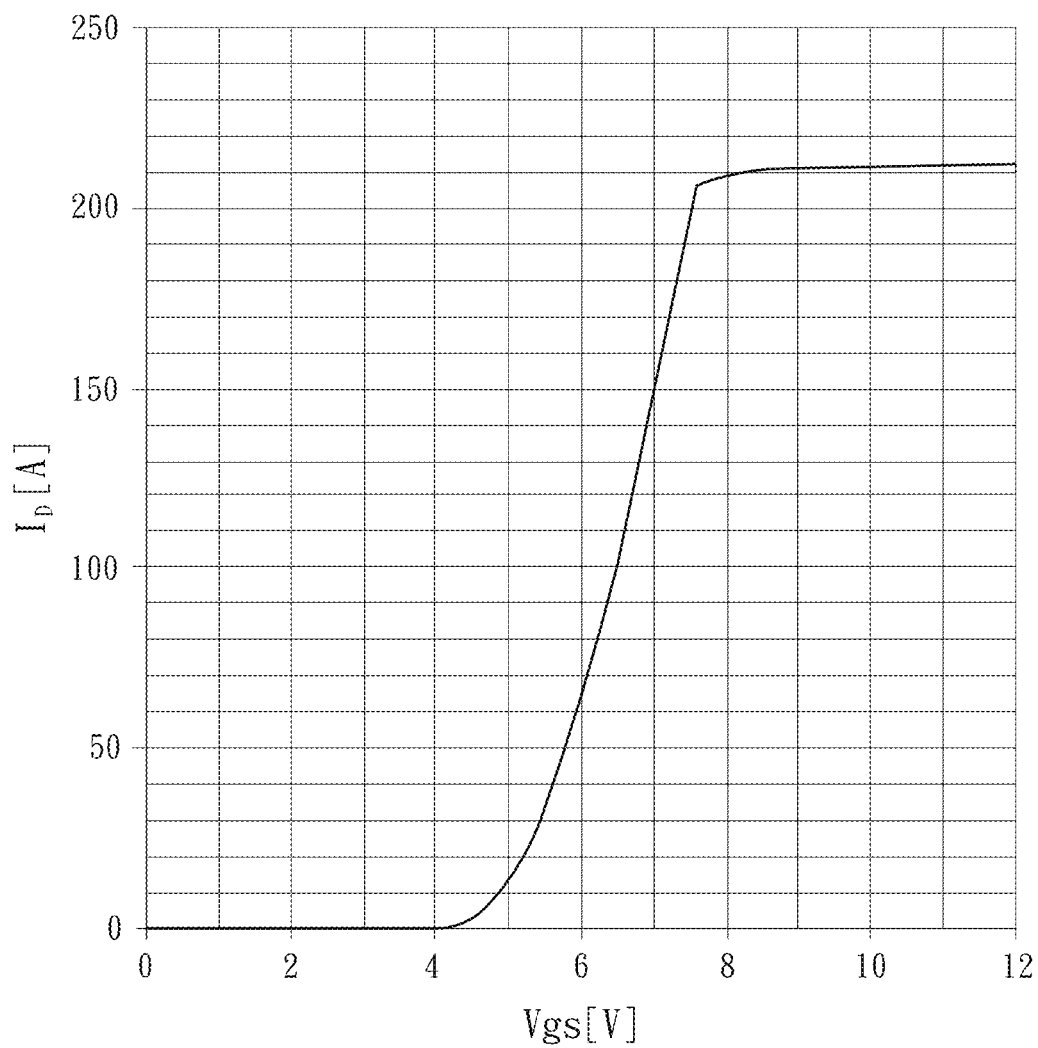
FIG. 1 is a schematic diagram of transfer characteristics of drain current ($I_D$) versus gate voltage (Vgs) of a conventional Si MOSFET.
Figure 2:
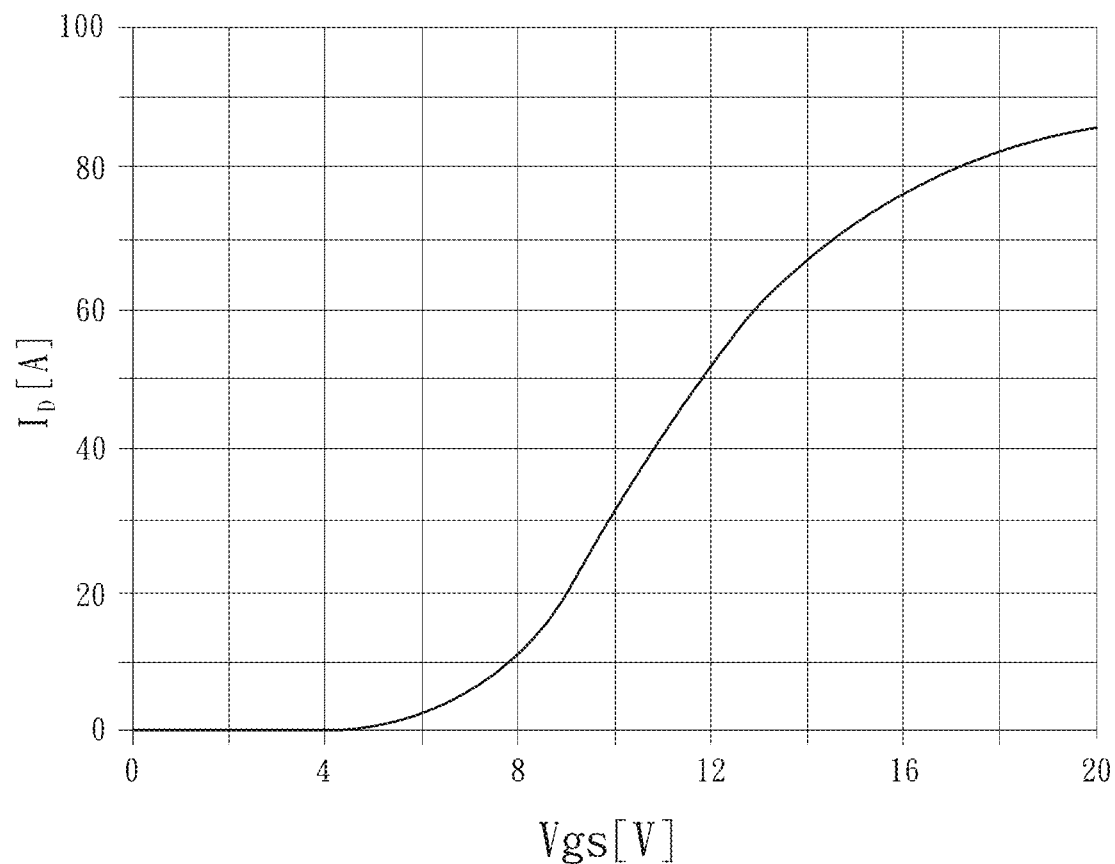
FIG. 2 is a schematic diagram of transfer characteristics of drain current ($I_D$) versus gate voltage (Vgs) of a conventional SiC MOSFET.
Figure 3:
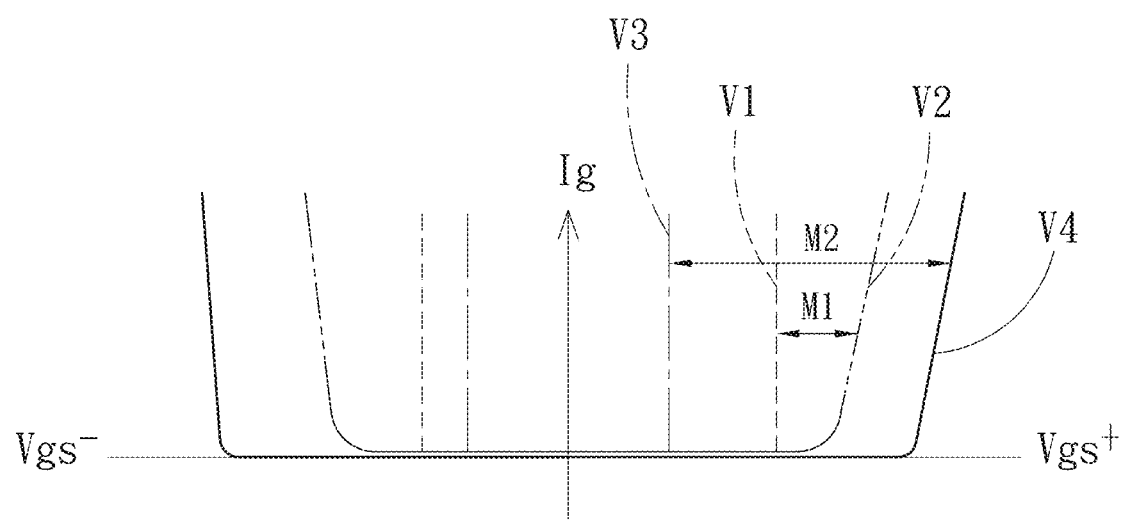
FIG. 3 is a schematic diagram of the difference in margins between suggested operating voltages and breakdown voltages of a gate oxide layer of a Si MOSEFT and a SiC MOSFET.
Figure 4:
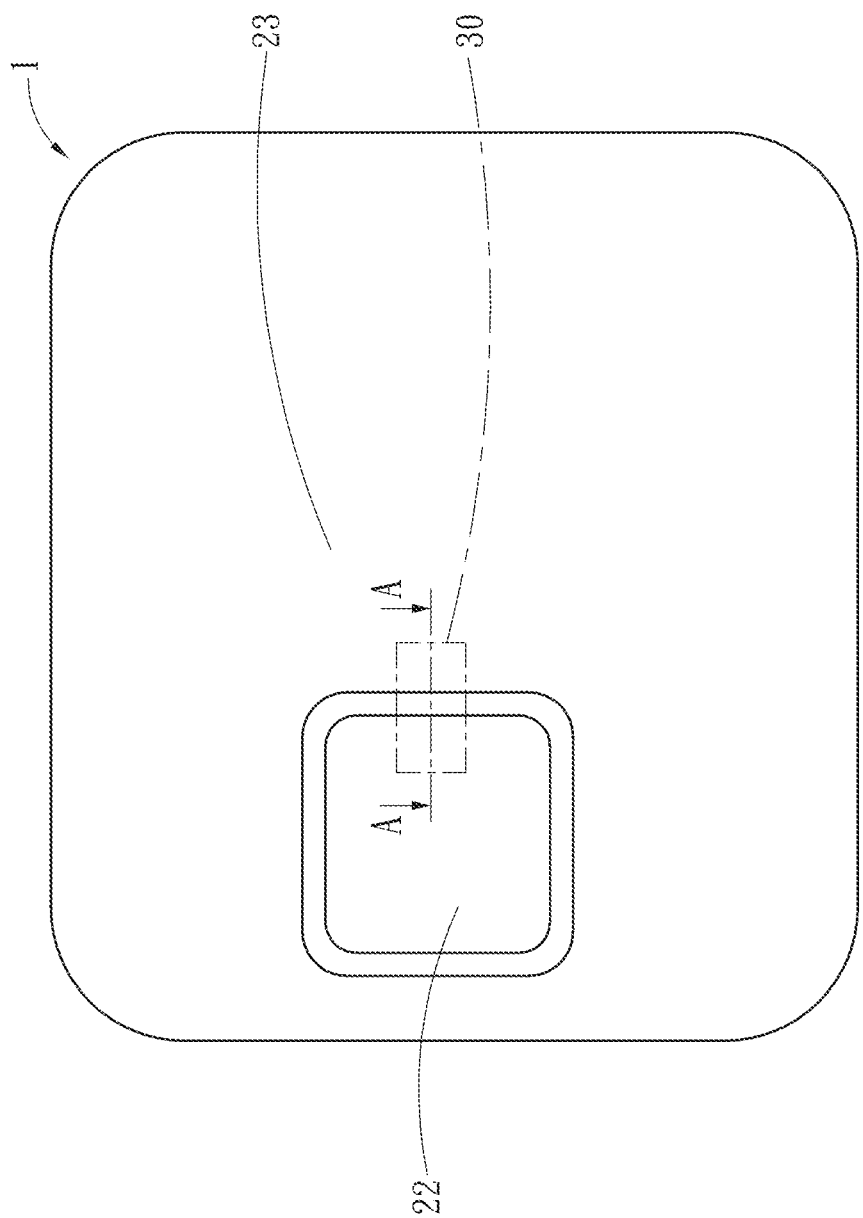
FIG. 4 is a top schematic diagram of a SiC semiconductor device integrating a clamper circuit for clamping voltage according to an embodiment of the present invention.
Figure 5:
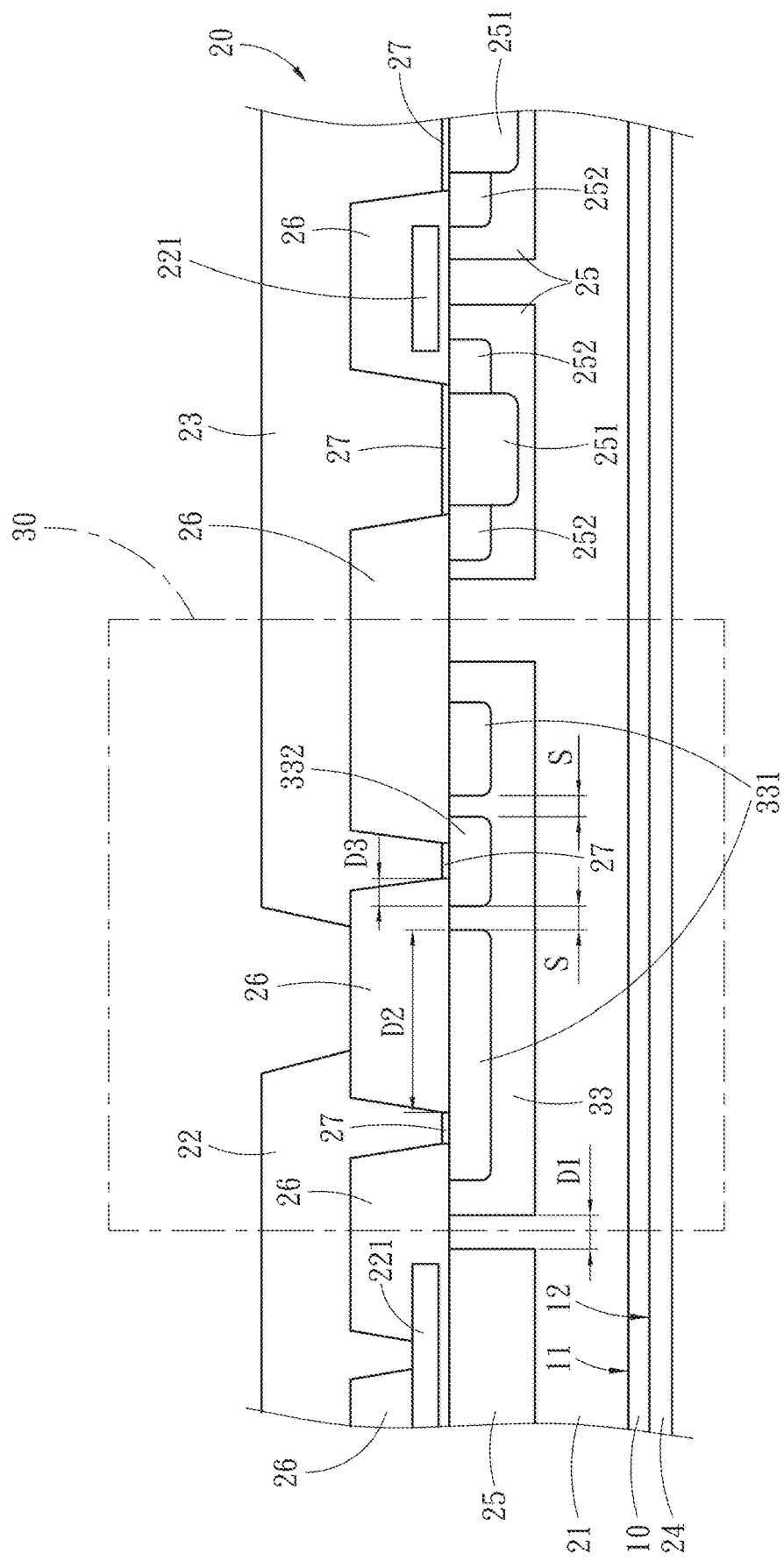
FIG. 5 is a sectional schematic diagram of FIG. 4 along A-A.

The present invention provides a silicon carbide (SiC) semiconductor device integrating a clamper circuit for clamping voltage. Referring to FIG. 4 and FIG. 5, FIG. 4 shows a schematic diagram of a SiC semiconductor device integrating a clamper circuit for clamping voltage according to an embodiment of the present invention, and FIG. 5 shows a sectional schematic diagram of FIG. 4 along A-A. A SiC semiconductor device 1 integrating a clamper circuit for clamping voltage according to an embodiment of the present invention includes a SiC substrate 10, a metal-oxide-semiconductor field-effect transistor (MOSFET) 20 and a bidirectional voltage clamp 30. The MOSFET 20 can be a planar MOSFET or a trench MOSFET.

According to an embodiment of the present invention, the MOSFET 20 includes a SiC n-type drift layer 21, a gate 22, a source 23 and a drain 24. The SiC substrate 10 includes a first surface 11 and a second surface 12 opposite to each other. The SiC n-type drift layer 21, the gate 22 and the source 23 are disposed adjacent to the first surface 11, and the drain 24 is disposed adjacent to the second surface 12. The SiC n-type drift layer 21 is disposed on the first surface 11, and can have a doping concentration ranging from $1E14$ $cm^{-3}$ to $1E17$ $cm^{-3}$. The gate 22 includes a gate electrode 221 disposed on the SiC n-type drift layer 21.

The MOSFET 20 further includes a plurality of p-type wells 25 and an insulator 26. The p-type wells 25 are arranged at intervals from one another in the SiC n-type drift layer 21, a part of the p-type wells 25 include at least one p-type region 251 and at least one n-type region 252, as shown by the p-type wells 25 on the right of FIG. 5, and a part of the p-type wells 25 do not include the p-type region 251 or the n-type region 252, as shown by the p-type wells 25 on the left of FIG. 5. In this embodiment, the doping concentration of the p-type regions 251 can be in a range from $1E18$ $cm^{-3}$ to $1E20$ $cm^{-3}$, and the doping concentration of the n-type region 252 can be in a range from $1E19$ $cm^{-3}$ to $1E20$ $cm^{-3}$. The SiC n-type drift layer 21 or the n-type region 252 can be individually and respectively doped by phosphorous or nitrogen, and the p-type well 25 and/or the p-type region 251 can be doped by aluminum or boron. The insulator 26 is disposed on the SiC n-type drift layer 21, and can be formed by thermal oxidation or be formed from a material having a high dielectric constant (e.g., aluminum oxide, $Al_2O_3$) through chemical vapor deposition or atomic layer deposition, and is processed by nitridation by post oxide annealing with a nitrogen-containing gas (e.g., $N_2$, NO, or $N_2O$) at a temperature of higher than 1000° C. At least a part of the bottom end of the source 23 forms an ohmic contact 27 to electrically connect to a part of the n-type region 252 and a part or all of the p-type region 251.

Figure 6:
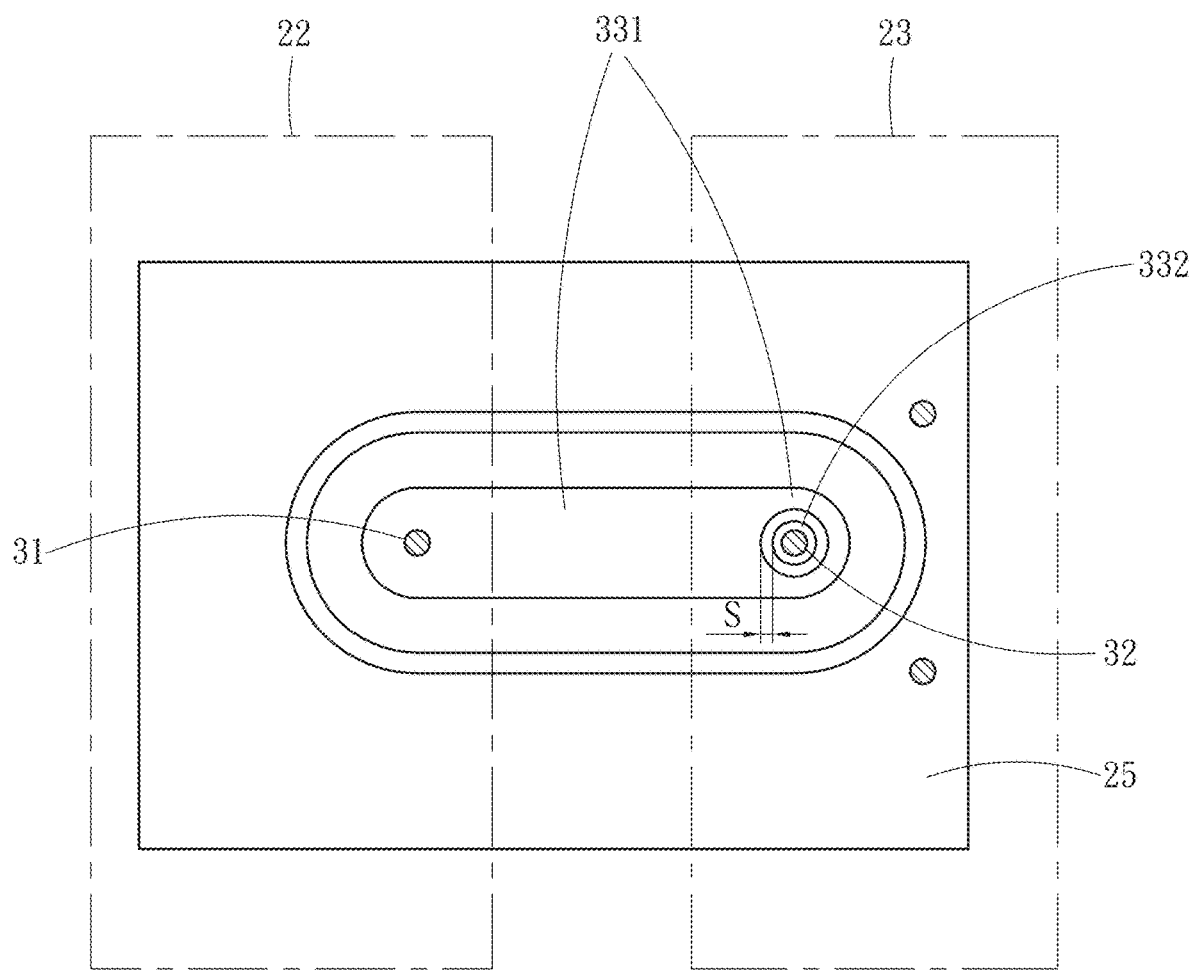
FIG. 6 is a partial top schematic diagram of FIG. 5.

Referring to FIG. 6 showing a partial top schematic diagram of FIG. 5, the bidirectional voltage clamp 30 is formed in the SiC n-type drift layer 21, and the bidirectional voltage clamp 30 includes a first terminal 31, a second terminal 32 and a p-floating region 33. The p-floating region 33 is spaced from the p-type well 25 by a first distance D1, and the p-floating region 33 can be formed by doping aluminum or boron. Further, the p-floating region 33 includes at least one first n-type region 331 formed by doping phosphorous or nitrogen and at least one second n-type region 332. The first n-type region 331 and the second n-type region 332 are separated from each other by a spacer region S. Between the first terminal 31 and the spacer region S is a second distance D2, and between the second terminal 32 and the spacer region S is a third distance D3, wherein the second distance D2 is greater than the third distance D3. It is seen from FIG. 5 that, in this embodiment, the width of the spacer region S along the edge of the second n-type region 332 is an equal distance. In other embodiments, the width of the spacer region S along the edge of the second n-type region 332 can be an unequal distance. In the p-floating region 33, the first terminal 31 is connected to the gate electrode 221 through the ohmic contact 27 on the first n-type region 331, and the second terminal 32 is connected to the source 23 through the ohmic contact 27 on the second n-type region 332. Accordingly, a positive overvoltage and a negative overvoltage between the gate 22 and the source 23 can be suppressed by the bidirectional voltage clamp 30. Further, in this embodiment, an absolute value of the positive overvoltage is greater than an absolute value of the negative overvoltage.

In addition, the absolute values of the positive overvoltage and the negative overvoltage are both smaller than absolute values of positive and negative gate-to-source breakdown voltages of the MOSFET 20.

The p-floating region 33 can include a retrograde doping profile, in which a doping concentration at a top portion is lower than a doping concentration at a bottom portion. Viewing from a vertical direction, the bidirectional voltage clamp 30 can be regarded as a parasitic bipolar junction transistor (BJT), and by adjusting the concentration distribution of the p-floating region 33, the open base breakdown voltage of the parasitic BJT can be adjusted.

In another embodiment of the present invention, the bidirectional voltage clamp 30 can further include a plurality of p-floating regions 33 connected in parallel. Because the amount of energy that can be absorbed by one single bidirectional voltage clamp 30 is limited, the number or area of the p-floating regions 33 can be increased to boost the tolerance against electrostatic discharged (ESD).

Figure 7:
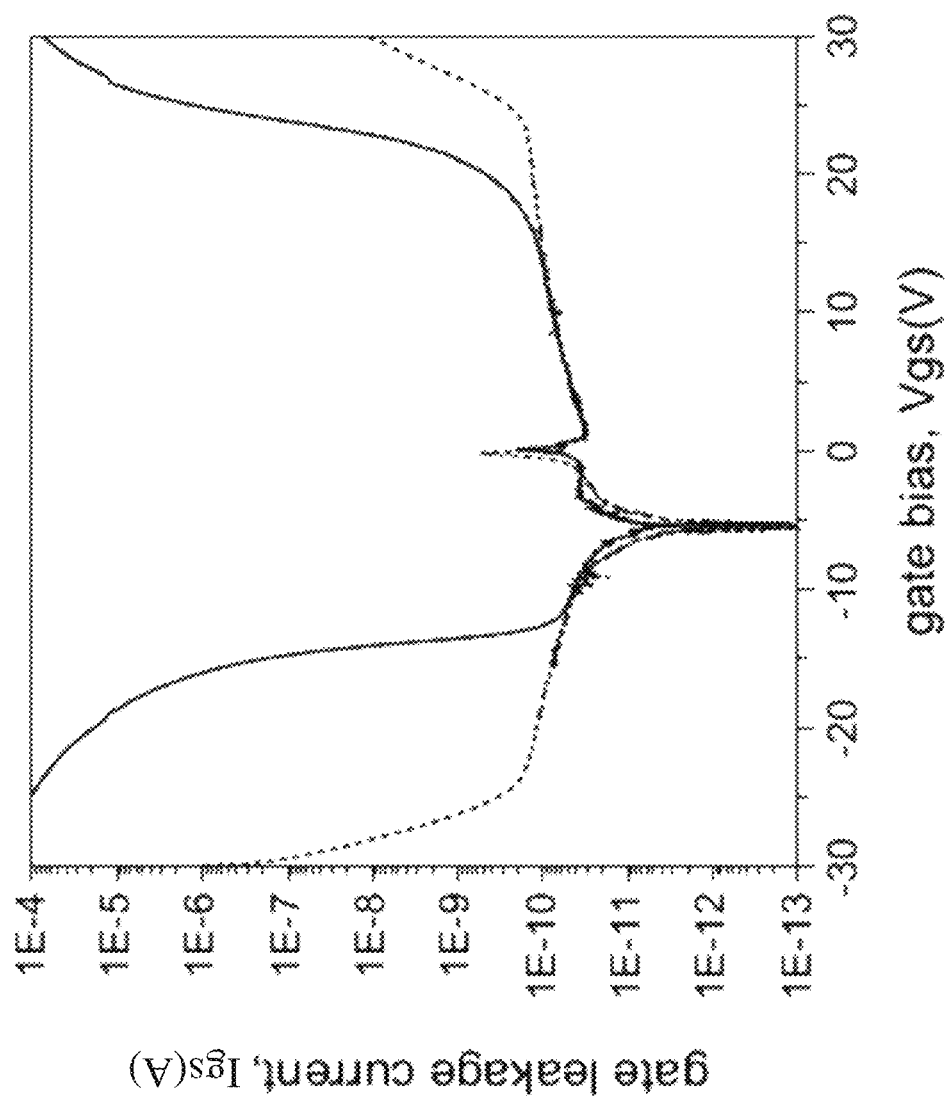
FIG. 7 depicts curves of gate leakage current (Igs) versus gate/source voltage (Vgs) of a SiC semiconductor device integrating a clamper circuit for clamping voltage according to an embodiment of the present invention and a conventional SiC semiconductor device without a damper circuit for clamping voltage.

Referring to FIG. 7, by comparing a curve (in a solid line) of gate leakage current (Igs) versus gate/source voltage (Vgs) of the SiC semiconductor device integrating a clamper circuit for clamping voltage according to an embodiment of the present invention with that (in a dotted line) of a conventional SiC semiconductor device without a damper circuit for clamping voltage, the results show that, within a suggested gate/source voltage (Vgs) range (i.e., the gate/source voltage (Vgs) is in a range from −10 V to 20 V), the leakage current (Igs) of the SiC semiconductor device of the embodiment is extremely low, at approximately several nA; however, under similar conditions, the leakage current (Igs) of a SiC semiconductor device integrating a polysilicon Zener diode can reach as high as several μA. It is apparent that the SiC semiconductor device of the present embodiment is capable of providing protection against both the positive overvoltage and negative overvoltage between the gate and the source.

Figure 8:
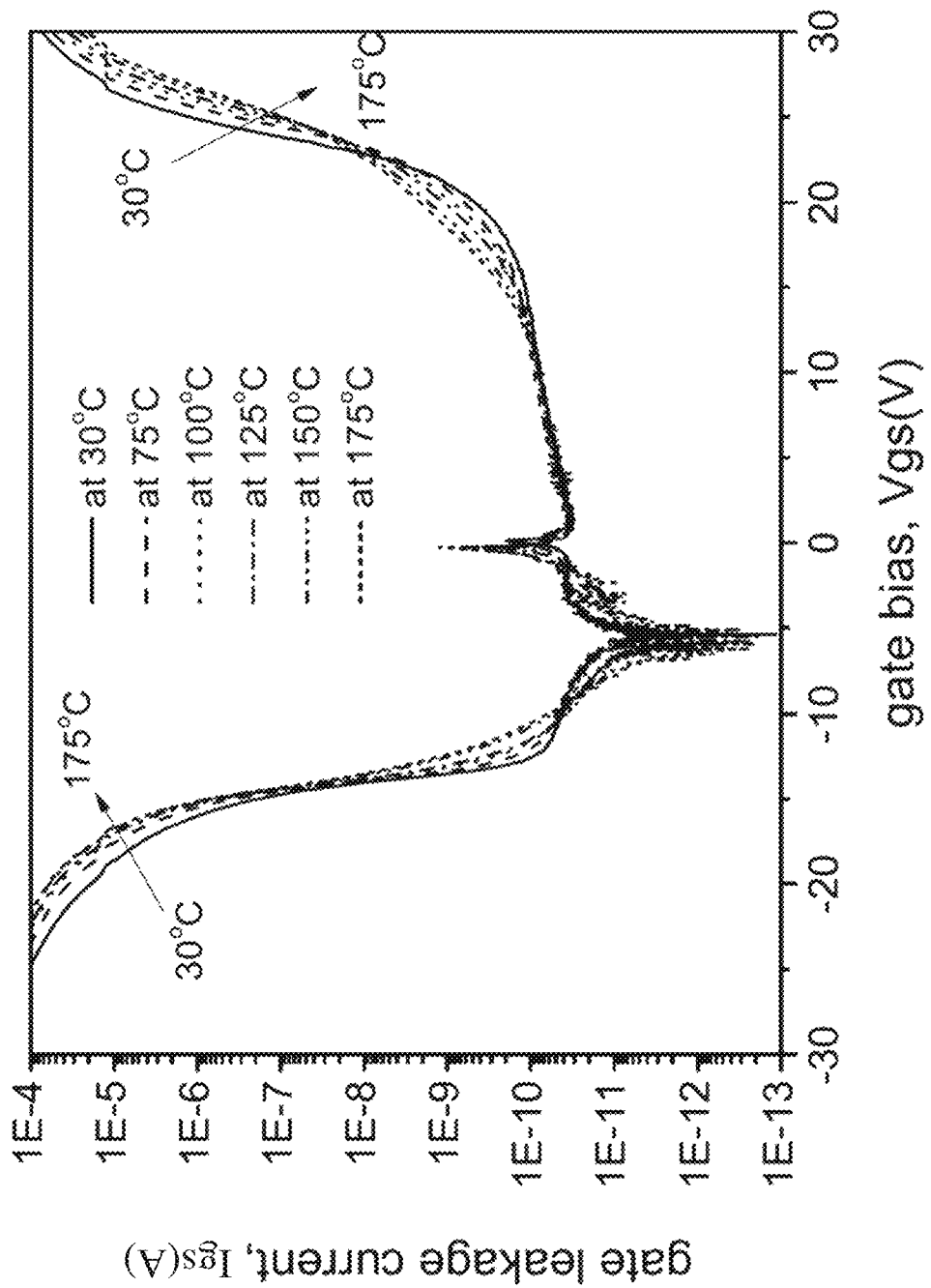
FIG. 8 depicts curves of gate leakage current (Igs) versus gate voltage (Vg) of a SiC semiconductor device integrating a clamper circuit for clamping voltage according to an embodiment of the present invention under different temperatures.

FIG. 8 shows curves of gate leakage current (Igs) versus gate voltage (Vg) of the SiC semiconductor device integrating a clamper circuit for clamping voltage according to an embodiment of the present invention under different temperatures. The results show that, under different temperatures between 30° C. and 175° C., the curve of gate leakage current (Igs) versus gate voltage (Vg) of the SiC semiconductor device according to the present embodiment is not drastically changed, indicating a lower sensitivity to temperature. Therefore, even under high temperatures, instability issues such as a decreased breakdown voltage and an increased leakage current possibly occurring in the SiC semiconductors disclosed by the U.S. Pat. Nos. 6,172,383 and 6,413,822 are eliminated.

In conclusion, comparing with the prior art, for example, the U.S. Pat. No. 9,627,383, which provides protection for only a negative overvoltage between the gate and the source, the design of the present invention is capable of avoiding device damage caused by a positive overvoltage and a negative overvoltage between the gate and the source through the SiC semiconductor device integrating a MOSFET and a clamper circuit for clamping voltage of the present invention, further achieves the object of device protection.

What is claimed is:

1. A silicon carbide (SiC) semiconductor device, integrating a damper circuit for clamping voltage, comprising:
    a SiC substrate, comprising a first surface and a second surface opposite to the first surface;
    an n-channel metal-oxide-semiconductor field-effect transistor (MOSFET), comprising a SiC n-type drift layer, a gate, a source and a drain, wherein the SiC n-type drift layer, the gate and the source are disposed adjacent to the first surface and the drain is disposed adjacent to the second surface, the SiC n-type drift layer is provided with a plurality of p-type wells arranged at intervals, at least one p-type region disposed at the p-type well, at least one n-type region disposed at the p-type well, an insulator disposed on the SiC n-type drift layer, and a gate electrode connected to the gate; and
    a bidirectional voltage clamp, disposed on the first surface, and comprising a first terminal connected to the gate and a second terminal connected to the source.

2. The SiC semiconductor device of claim 1, wherein the bidirectional voltage clamp comprises at least one p-floating region spaced from the p-type well by a first distance, the p-floating region comprises a first n-type region and a second n-type region, the first n-type region and the second n-type region are separated from each other by a spacer region, the first terminal is connected to the gate electrode through an ohmic contact on the first n-type region, and the second terminal is connected to the source through an ohmic contact on the second n-type region.

3. The SiC semiconductor device of claim 2, wherein between the first terminal and the spacer region is a second distance, between the second terminal and the spacer region is a third distance, and the second distance is greater than the third distance.

4. The SiC semiconductor device of claim 2, wherein the p-floating region comprises a retrograde doping profile, in which the p-floating region comprises a bottom portion and a top portion comprising a doping concentration lower than that of the bottom portion.

5. The SiC semiconductor device of claim 1, wherein the MOSFET is a planar MOSFET.

6. The SiC semiconductor device of claim 1, wherein the MOSFET is a trench MOSFET.

7. The SiC semiconductor device of claim 1, wherein the bidirectional voltage clamp suppresses a positive overvoltage and a negative overvoltage applied between the gate and the source.

8. The SiC semiconductor device of claim 7, wherein absolute values of the positive overvoltage and the negative overvoltage are smaller than absolute values of positive and negative gate-to-source breakdown voltages of the MOSFET.

9. The SiC semiconductor device of claim 7, wherein an absolute value of the positive overvoltage is greater than an absolute value of the negative overvoltage.

10. The SiC semiconductor device of claim 1, wherein the bidirectional voltage clamp comprises a plurality of p-floating regions connected in parallel.

* * * * *